United States Patent [19]

Kawashima et al.

[11] 4,291,231
[45] Sep. 22, 1981

[54] ELECTRON BEAM EXPOSURE SYSTEM AND AN APPARATUS FOR CARRYING OUT THE SAME

[75] Inventors: Kenichi Kawashima, Yokohama; Hiroshi Yasuda; Kenyu Uema, both of Tokyo, all of Japan

[73] Assignee: Fujitsu Limited, Japan

[21] Appl. No.: 971,693

[22] Filed: Dec. 21, 1978

[30] Foreign Application Priority Data

Dec. 30, 1977 [JP] Japan .................. 52-158411

[51] Int. Cl.$^3$ .............................................. H01J 37/00
[52] U.S. Cl. .................................. 250/492 A; 250/442
[58] Field of Search ............... 250/396 R, 398, 492 A, 250/492 B, 442; 313/359, 361

[56] References Cited

U.S. PATENT DOCUMENTS

| | | | |
|---|---|---|---|
| 3,900,737 | 8/1975 | Collier et al. | 250/492 A |
| 4,051,381 | 9/1977 | Trotel | 250/398 |
| 4,132,898 | 1/1979 | Buelow et al. | 250/492 A |
| 4,147,937 | 4/1979 | Buelow et al. | 250/492 A |
| 4,151,422 | 4/1979 | Goto et al. | 250/492 A |

OTHER PUBLICATIONS

"A Computer-Controlled Electron-Beam Machine for Microcircuit Fabrication", Chang et al., *IEEE Transactions on Electron Devices*, vol. 19, No. 5, May 1972, pp. 629-635.

"Scanning Electron Beam Lithography for Fabrication of Magnetic Bubble Circuits", Chang et al., *IBM Jour. Research and Development*, vol. 20, No. 4, Jul. 1976, pp. 376-388.

"Spot Shaping for Electron-Beam Lithography", Pfeiffer, *J. Vac. Sci. Technol.*, 15, May, Jun. 1978, pp. 887-890.

*Primary Examiner*—Bruce C. Anderson
*Attorney, Agent, or Firm*—Staas & Halsey

[57] ABSTRACT

Electron beam exposure system provides a basic pattern data memory for storing data corresponding to the dimensions and the positions of patterns of a basic unit pattern which frequently appears as a unit in a pattern to be exposed on a wafer, and a central processing unit provided with an additional memory system which stores data corresponding to the position at which the basic unit pattern is to be exposed. This system determines the position of the basic unit pattern by adding data from the basic pattern data memory and data from the additional memory system through the central processing unit in accordance with a command of the central processing unit. Thereafter, data corresponding to the dimensions of the patterns in the basic unit patterns from the basic pattern data memory are sent as an input to a deflection system. As a result, the system according to the present invention applies electron beam deflection signals, which are produced by using the obtained data corresponding to the positions and the dimensions of the basic unit patterns, to the deflecting means of the electron beam exposure apparatus.

8 Claims, 5 Drawing Figures

Fig. 1

| $\alpha_1$ | $\alpha_2$ | $\alpha_3$ | $\alpha_4$ | $\alpha_5$ | $\alpha_6$ | $\alpha_7$ | $\alpha_8$ | $\alpha_9$ |
|---|---|---|---|---|---|---|---|---|
| $\alpha_{10}$ | $\alpha_{11}$ | $\alpha_{12}$ | $\alpha_{13}$ | $\alpha_{14}$ | $\alpha_{15}$ | $\alpha_{16}$ | $\alpha_{17}$ | $\alpha_{18}$ |
| $\alpha_{19}$ | $\alpha_{20}$ | $\alpha_{21}$ | $\alpha_{22}$ | $\alpha_{23}$ | $\alpha_{24}$ | $\alpha_{25}$ | $\alpha_{26}$ | $\alpha_{27}$ |
| $\alpha_{28}$ | $\alpha_{29}$ | $\alpha_{30}$ | $\alpha_{31}$ | $\alpha_{32}$ | $\alpha_{33}$ | $\alpha_{34}$ | $\alpha_{35}$ | $\alpha_{36}$ |
| $\alpha_{37}$ | $\gamma_1$ | $\alpha_{38}$ | $\alpha_{39}$ | $\beta_1$ | $\alpha_{40}$ | $\alpha_{41}$ | $\gamma_2$ | $\alpha_{42}$ |
| $\alpha_{43}$ | $\alpha_{44}$ | $\alpha_{45}$ | $\alpha_{46}$ | $\alpha_{47}$ | $\alpha_{48}$ | $\alpha_{49}$ | $\alpha_{50}$ | $\alpha_{51}$ |
| $\alpha_{52}$ | $\alpha_{53}$ | $\alpha_{54}$ | $\alpha_{55}$ | $\alpha_{56}$ | $\alpha_{57}$ | $\alpha_{58}$ | $\alpha_{59}$ | $\alpha_{60}$ |
| $\alpha_{61}$ | $\alpha_{62}$ | $\alpha_{63}$ | $\alpha_{64}$ | $\alpha_{65}$ | $\alpha_{66}$ | $\alpha_{67}$ | $\alpha_{68}$ | $\alpha_{69}$ |
| $\alpha_{70}$ | $\alpha_{71}$ | $\alpha_{72}$ | $\alpha_{73}$ | $\alpha_{74}$ | $\alpha_{75}$ | $\alpha_{76}$ | $\alpha_{77}$ | $\alpha_{78}$ |

Fig. 5

| ADDRESS | X₁ Y₁ X₂ Y₂ | |
|---|---|---|
| $P_1 \sim P_i$ | DATA OF BASIC UNIT PATTERN "A" | ⎫ DATA IN CHIP α ⎫ |
| $P_{i+1} \sim P_j$ | 〃 〃 〃 "B" | ⎪ ⎪ |
| $P_{j+1} \sim P_k$ | 〃 〃 〃 "C" | ⎬ ⎪ |
| $P_{k+1} \sim P_l$ | 〃 〃 〃 "D" | ⎪ ⎪ |
| $P_{l+1} \sim P_m$ | 〃 〃 〃 "E" | ⎭ ⎪ |
| $P_{m+1}$ | | ⎫ ⎪ DATA IN MASK OR WAFAR |
| | | ⎬ DATA IN CHIP β ⎪ |
| $\sim P_n$ | . | ⎭ ⎪ |
| $P_{n+1} \sim$ | | ⎫ ⎪ |
| | | ⎬ DATA IN CHIP γ ⎪ |
| $\sim P_z$ | | ⎭ ⎭ |

ELECTRON BEAM EXPOSURE SYSTEM AND AN APPARATUS FOR CARRYING OUT THE SAME

FIELD OF THE INVENTION

The present invention relates to an electron beam exposure system which can expose a pattern onto a wafer with a high degree of efficiency utilizing an electron beam having a rectangular cross section. However, the present invention is also applicable to all kinds of digitally controlled electron beam exposure apparatus including the so-called flying spot type apparatus.

BACKGROUND OF THE INVENTION

In accordance with the recent development of an ultra-large scale integrated circuit, a developed technique and an electron beam exposure system are used for the purpose of forming very fine patterns. This electron beam exposure apparatus can form very fine patterns as disclosed in many publications such as, for example, H. C. Pfeiffer, "Variable Spot Shaping for Electron-beam Lithography", J. Vac. Sci. Technol., 15(3), May/June, 1978, pages 887 through 890. However, in the electron beam lithographic process disclosed in this publication exposure of the pattern cannot be carried out at high speed; therefore, such electron beam lithography exhibits some problems during practical use.

For removing the drawbacks of the conventional system, a new apparatus as will be described hereinafter was developed. In this new apparatus, exposure of the pattern is carried out by using an electron beam having a rectangular section which can be varied in accordance with the form of the pattern to be exposed. This new apparatus was disclosed in many articles such as, for example, T. H. P. Chang et al, "Scanning Electron Beam Lithography for Fabrication of Magnetic Bubble Circuits", IBM Journal of Research and Development, Vol. 20, No. 4, July, 1976, pages 376 through 388.

Usually, the electron beam exposure apparatus is controlled by a central processing unit, and the data of numerous patterns are used in the electron beam exposure apparatus. For example, about one million rectangular patterns are required for exposing a large scale integrated circuit (LS1) by using an electron beam exposure apparatus which uses an electron beam having a rectangular section, and the data corresponding to one pattern include the data of the position (coordinate of an initial point) $(X_1, Y_1)$ and of the dimension (size of the pattern) $(X_2, Y_2)$. Such data can be derived from binary information, for example, a digital number with 16 bits, therefore, information corresponding to one pattern is composed of 64 bits, and the information corresponding to one million patterns is composed of 64 megabits. A preferable exposing speed of a conventionally used electron beam exposure apparatus is one chip per second, that is, one million patterns per second, therefore, the data transfer speed of the apparatus is 64 megabits per second. Such pattern data are stored in a suitable memory and read out in accordance with a command of the central processing unit. The transfer speed of 64 megabits per second can only be realized by using a very high speed memory such as that used in a large scale electronic computer. The magnetic disc, which has a large capacity and which is widely used in the election beam exposure system, cannot be used due to the fact that the memory of the magnetic disc cannot be operated at such a high speed. Further, utilization of an electronic computer having a large capacity, high speed semiconductor memory in electron beam lithography is not economical.

OBJECTS AND SUMMARY OF THE INVENTION

An object of the present invention is to provide an electron beam exposure system which can be used to carry out high speed electron beam lithography without increasing the capacity of the memory for storing pattern data.

Another object of the present invention is to provide an electron beam exposure apparatus which provides a memory for storing the data corresponding to "basic unit patterns" or patterns of region to be exposed included in one chip, which projects the pattern of a basic unit pattern at positions which are specified by a central processing apparatus or a control circuit, and the apparatus which repeats the above-mentioned operation until the exposure of whole repetitive basic unit patterns in the chip is completed.

For the purpose of achieving the above-mentioned objects, the electron beam exposure system according to the present invention comprises a basic unit pattern data memory means for storing data corresponding to dimensions and the positions of patterns of at least one basic unit pattern which appears as an unit more than once in said desired patterns to be exposed; a central processing means for providing data corresponding to a position at which said basic unit pattern is to be exposed; a first means for determing the position of said basic pattern by adding the data of the position which is read from said basic unit pattern memory means and the data of the position which is provided by said central processing means, in accordance with a command of said central processing means; a second means for providing data of one of said dimensions from said basic pattern data memory means; a third means for providing election beam deflection signals based on the data of one of said dimensions which are provided by said second means and based on the position which is determined in said first means; and a deflection means for determining the dimension of a cross section of the electron beam and the projecting position of the electron beam, said deflecting means being controlling by said electron beam deflection signals.

Furthermore, for the purpose of achieving the above-mentioned objects, the electron beam exposure apparatus according to the present invention comprises a basic pattern data memory for storing information corresponding to dimensions $(X_2, Y_2)$ and to positions $(X_1, Y_1)$ of a plurality of patterns of at least one basic unit pattern in each of the addresses $(P_1, P_2, \ldots)$; a central processing unit which is provided with an additional memory means for storing information corresponding to positions $(X_3, Y_3)$ at which the basic unit pattern is to be exposed, said additional memory means being controlled by said central processing unit; a clock circuit which is controlled by the central processing unit and which actuates the basic unit pattern data memory to provide information therein; an address counter which is connected to the clock circuit and which sets a first address of the basic unit pattern memory, said first address being provided by the central processing unit; a final data address register for storing a final data address provided by the central processing unit; a coincidence circuit which instructs the central processing unit that exposure of the pattern is finished when the contents of the address counter and the contents of the final address register coincide a first register and a second register for storing the position data ($X_3$, $Y_3$) which are provided from the additional memory through the central processing unit; a first adder and a second adder for respectively adding the contents of the first and second registers and position data ($X_1$, $Y_1$) from the basic unit pattern data memory; a first digital analog converter and a second digital analog converter for respectively converting the outputs of the first and second adders to analog outputs and for supplying the analog outputs to a first deflector means for determining the positions of the basic unit patterns; a third digital analog converter and a fourth digital analog converter for converting the data of the dimension ($X_2$, $Y_2$) derived from the basic unit pattern data memory to analog outputs and for supplying the analog outputs to a second deflector means for controlling the dimension of a cross section of the electron beam; and means for displacing the position of the material to be exposed in accordance with the command of the central processing unit.

Further features and advantages of the present invention will be apparent from the ensuing description with reference to the accompanying drawings to which, however, the scope of the invention is in no way limited.

BRIEF DESCRIPTION OF THE DRAWINGS

FIG. 1 shows a pattern on a mask plate to be produced by an exposure process in the electron beam exposure apparatus according to the present invention;

FIG. 5 shows one example of the content of the basic unit pattern data memory shown in the block diagram of FIG. 4.

DETAILED DESCRIPTION OF THE INVENTION

Usually, the whole pattern used for forming large-scale integrated circuits such as memory or logic circuits is formed by combining particular kinds of basic unit patterns. The basic unit patterns are not always arranged in such a manner that the same kinds of patterns are located adjacent to each other. However, these basic unit patterns are frequently arranged in such a manner that certain kinds of basic unit patterns are combined with each other. Therefore, for the purpose of exposing the whole pattern, it is necessary that data corresponding to the number of patterns in a chip should be transferred within, for example, one second. Furthermore, a basic unit pattern is usually formed of from several patterns to several thousand patterns.

Therefore, in the present invention, the electron beam exposure apparatus provides a memory for storing the data corresponding to these basic unit patterns or patterns of regions to be exposed. The data stored in the memory are read out, if necessary, and the basic unit pattern according to the read data is exposed at positions which are specified by the central processing unit or the control circuit included in the electron beam exposure apparatus. For the purpose of specifying these positions, a memory system which is controlled by the central processing unit or the control circuit and which stores the data which designate the positions must be provided in this apparatus besides the basic unit pattern data memory. However, this memory system may be of the type operated at relatively low speed and having a small capacity. Similar operation is carried out with respect to the data of whole basic unit patterns which are stored in the memory, and the exposure of one chip is completed.

FIG. 1 shows a rough sketch on a mask plate which is used in a photo-lithographic process for a semiconductor wafer to produce an integrated circuit and has essentially the same patterns as those of the integrated circuit to be formed on the wafer. Although an exposure process to produce a photo-mask pattern is explained hereinafter, the system according to the present invention is also applicable to expose patterns directly onto any material including a semiconductor wafer to carry out the electron beam lithography. Referring to chips $\alpha_1$ through $\alpha_{78}$, chip $\beta_1$, and chips $\gamma_1$ and $\gamma_2$ shown in FIG. 1, the same letter designates a chip having the same pattern and the subscript attached to the letter designates the position of the chip.

Figure 2:
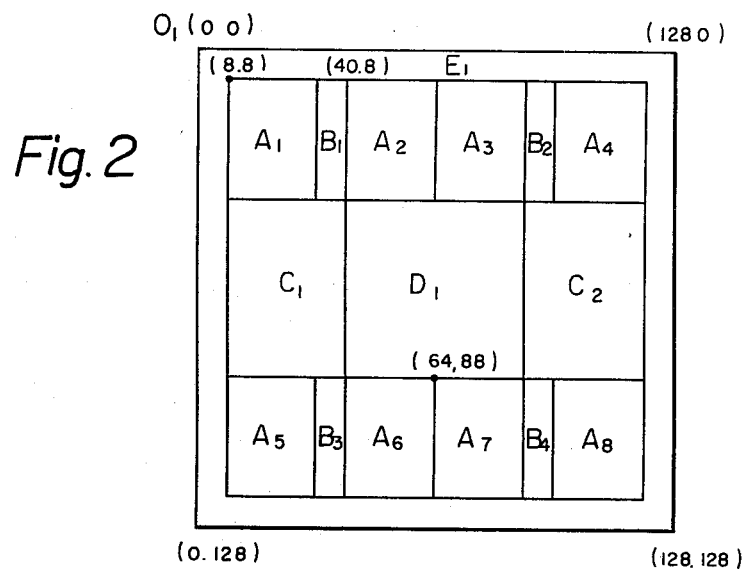
FIG. 2 shows the content of one chip in the mask plate shown in FIG. 1.

FIG. 2 shows an example of an $\alpha$ chip included in the mask plate shown in FIG. 1. The chips $\beta$ and $\gamma$ shown in FIG. 1 are used respectively for monitoring the mask when a test of the mask plate is carried out and for positioning the mask when the mask is exposed. However, the chips $\beta$ and $\gamma$ are not explained in detail in the specification. Because the contents of the chips $\beta$ and $\gamma$ are not related to the present invention, no inconvenience is therefore caused if explanation thereof is not included herein. Referring to the chip shown in FIG. 2, patterns $A_1$ through $A_8$ designate the basic unit pattern "A", patterns $B_1$ through $B_4$ designate the basic unit pattern "B", patterns $C_1$ and $C_2$ designate the basic unit pattern "C", and patterns $D_1$ and $E_1$ designate the basic unit patterns "D" and "E", respectively. The position of each of these basic unit patterns is indicated by the subscript number shown below the letters corresponding to the different basic unit patterns.

Figure 3:
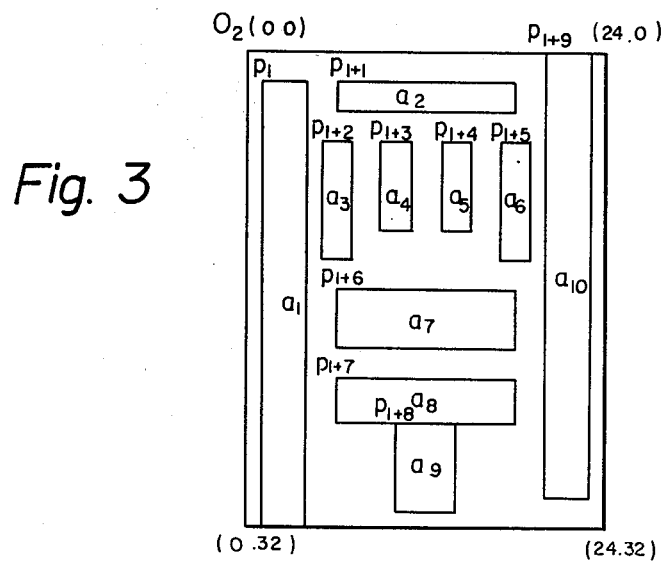
FIG. 3 shows the content of one pattern of regions to be exposed or basic unit pattern of the chip shown in FIG. 2.

FIG. 3 shows the basic unit pattern "A", included in the "$\alpha$" chip shown in FIG. 2. However, the contents of the basic unit patterns "B", "C", "D", "E" are not explained in this specification because no inconvenience is caused, if the explanation thereof is not given herein. Referring to FIG. 3, the basic unit pattern "A" is formed, for example by regions represented by data "$a_1$" through "$a_{10}$". When the initial coordinates of these data "$a_1$" through "$a_{10}$" are designated as $X_1$, $Y_1$ with reference to the point of origin $O_2$ (0, 0) of the basic unit pattern "A", when the dimensions of the data "$a_1$" through "$a_{10}$" are designated as $X_2$, $Y_2$, and when the initial coordinates of such data are corresponded to addresses P, $P_{1+1}$, ..., $P_{1+9}$, Table I as shown below can be obtained.

TABLE I

| Address | DATA OF BASIC UNIT PATTERN "A" | | | | |
|---|---|---|---|---|---|
| | Data | $X_1$ | $Y_1$ | $X_2$ | $Y_2$ |
| $P_1$ | $a_1$ | 1 | 2 | 3 | 30 |
| $P_{1+1}$ | $a_2$ | 6 | 2 | 12 | 2 |
| $P_{1+2}$ | $a_3$ | 5 | 6 | 2 | 8 |
| $P_{1+3}$ | $a_4$ | 9 | 6 | 2 | 6 |
| $P_{1+4}$ | $a_5$ | 13 | 6 | 2 | 6 |
| $P_{1+5}$ | $a_6$ | 17 | 6 | 2 | 8 |
| $P_{1+6}$ | $a_7$ | 6 | 16 | 12 | 4 |

TABLE I-continued

| | DATA OF BASIC UNIT PATTERN "A" | | | | |
|---|---|---|---|---|---|
| Address | Data | $X_1$ | $Y_1$ | $X_2$ | $Y_2$ |
| $P_{1+7}$ | $a_8$ | 6 | 22 | 12 | 3 |
| $P_{1+8}$ | $a_9$ | 10 | 25 | 4 | 6 |
| $P_{1+9}$ | $a_{10}$ | 20 | 0 | 3 | 30 |

Next, explanation will now be given for the basic unit pattern "A" which is to be exposed at a position $A_1$. Assuming that the initial coordinate of the basic unit pattern "A" at the position $A_1$ is $X_3=8$, $Y_3=8$ with reference to the point of origin $O_1$ (0, 0) of the $\alpha$ chip, the data $A_1a_1$ through $A_1a_{10}$ for exposing the basic unit pattern "A" at the position $A_1$ are shown in Table II, below, corresponding to the positions and the dimensions of data $a_1$ through $a_{10}$ with reference to the point of origin $O_1$ (0, 0) of the $\alpha$ chip.

TABLE II

| | DATA OF BASIC UNIT PATTERN "A" TO BE EXPOSED AT POSITION "$A_1$" | | | |
|---|---|---|---|---|
| | Position | | Dimension | |
| Data | $X_1 + X_3$ | $Y_1 + Y_3$ | $X_2$ | $Y_2$ |
| $A_1a_1$ | 9 | 10 | 3 | 30 |
| $A_1a_2$ | 14 | 10 | 12 | 2 |
| $A_1a_3$ | 13 | 14 | 2 | 8 |
| $A_1a_4$ | 17 | 14 | 2 | 6 |
| $A_1a_5$ | 21 | 14 | 2 | 6 |
| $A_1a_6$ | 25 | 14 | 2 | 8 |
| $A_1a_7$ | 14 | 24 | 12 | 4 |
| $A_1a_8$ | 14 | 30 | 12 | 3 |
| $A_1a_9$ | 18 | 33 | 4 | 6 |
| $A_1a_{10}$ | 28 | 8 | 3 | 30 |

The above-mentioned case involves the feature wherein the basic unit pattern "A" is exposed at the position $A_1$. Similarly, the basic unit pattern "A" is exposed at the positions, $A_2$, $A_3$, . . . , the basic unit pattern "B" is exposed at the positions $B_1$, $B_2$, . . . , and the other basic unit patterns "C" and "D" are exposed at desired positions. During exposing operations, the electronic computer, that is, the central pressing unit or the other control units, and the additional memory system storing position data included in the electron beam exposure apparatus, are actuated only at the time when the initial coordinate of the chip is set by the central processing unit and at the time when the position at which the basic unit pattern is to be exposed is designated by the central processing unit. Therefore, the electronic computer is not required to operate very rapidly. The basic pattern data memory can be designed in such a manner that the memory has a capacity for storing only one kind of basic unit pattern. When the exposure of the basic unit pattern is completed, the basic unit pattern is reset and the other basic unit patterns are stored. Furthermore, the memory may be designed so as to have a large capacity for storing all kinds of basic unit patterns at the same time, and the other data which are read out only once during the entire exposure process of the chip or the mask to expose unique patterns therein also can be stored in this memory.

Figure 4:
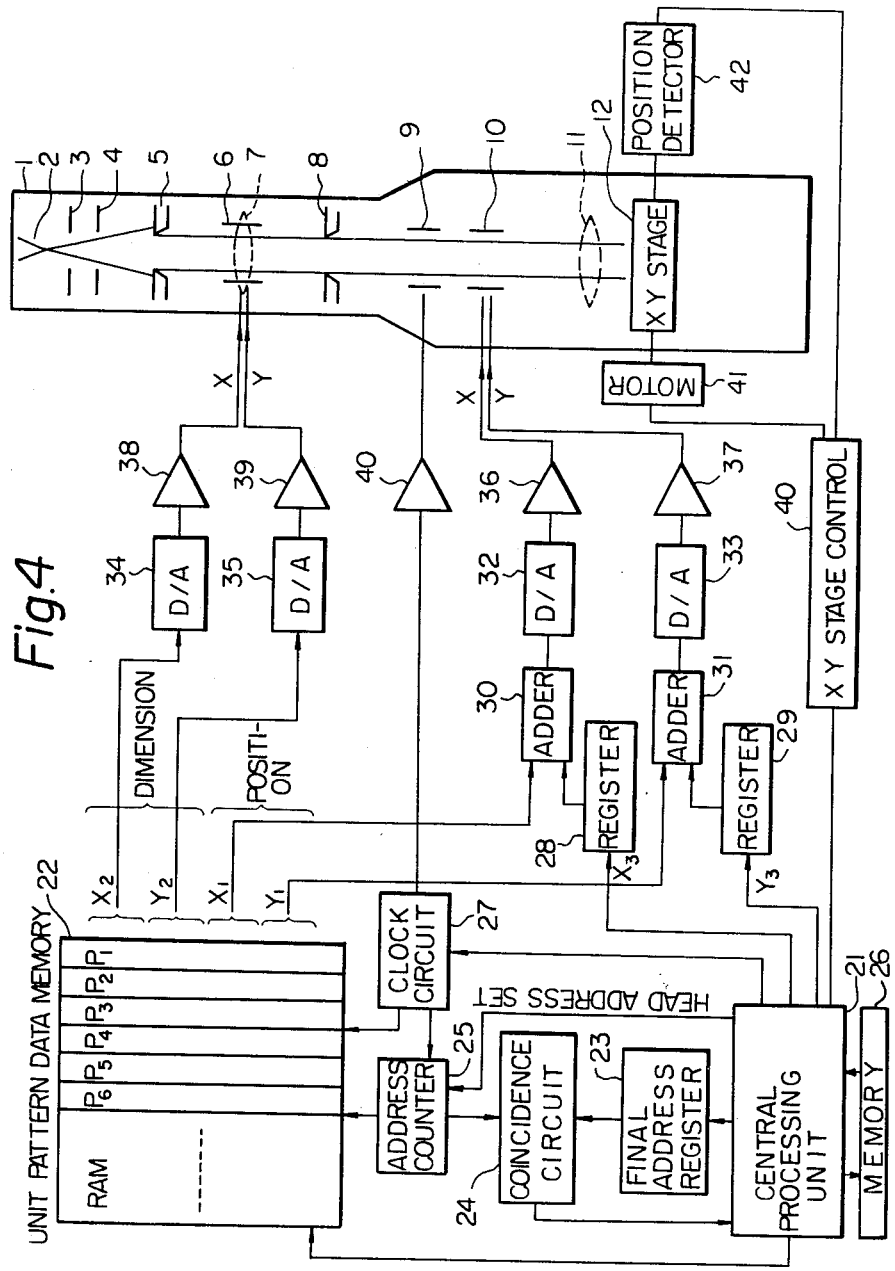
FIG. 4 shows a block diagram of one embodiment of the electron beam exposure apparatus according to the present invention.

FIG. 4 is a block diagram showing one embodiment of the apparatus according to the present invention. As shown in FIG. 4, the electron beam exposure apparatus of this embodiment includes an electron beam exposure column 1; the electron beam exposure column 1 comprises a cathode 2, a grid 3, an anode 4, a first slit 5, a first deflector 6 for changing the dimensions of the cross section of the electron beam, a first electron lens 7, a second slit 8, a blanking deflector 9, a second deflector 10 for determining the position to be exposed, a second electron lens 11, and an X-Y stage 12 on which a mask plate or a wafer can be mounted. Furthermore, the electron beam exposure apparatus comprises a central processing unit 21; a final data address register 23, an address counter 25, a clock circuit 27 and a basic unit pattern data memory 22, which are all connected to the central processing unit 21; a coincidence circuit 24 which is connected to the address counter 25 and the final data address register 23; a first register 28 and a second register 29 which are connected to the unit 21; a first adder 30 and a second adder 31 which receive the outputs of the first and the second registers 28, 29 and the output of the basic unit pattern data memory 22; digital-analog converters 32 and 33 which are connected to the adders 30, 31; digital-analog converters 34 and 35 which are connected to the basic pattern data memory 22; amplifiers 36 through 39 which are respectively connected to the digital-analog converters 32 through 35 and to the deflection system of the electron beam exposure column 1; a stage control 40 which is connected to the unit 21; an X-Y stage drive motor 41; and a position detector 42 for detecting the position of the X-Y stage 12.

In the embodiment shown in FIG. 4, the electron beam exposure column 1 utilizes an electron beam having a rectangular cross section. The electron beam exposure column 1 provides the first slit 5 and the second slit 8, and these slits 5, 8 respectively provide a rectangular hole. The image of the electron beam which is passed through the first slit 5 is focused at the position of the second slit 8 by the first electron lens 7, and the electron beam is deflected by the first deflector 6 which is placed between the first slit 5 and the second slit 8 so that the dimensions of the cross section of the electron beam passing through the second slit 8 are changed. The electron beam which passes through the second slit 8 is deflected by the second deflector 10 so as to direct the electron beam to a desired position on the mask plate on the X-Y stage 12. As a result, the cross section of this electron beam is contracted by the electron lens 11, and this electron beam is then projected onto the mask plate. According to the block diagram shown in FIG. 4, the first deflector 6 and the second deflector 10 are controlled by the electron beam exposure system according to the present invention, that is, the deflection control voltages are supplied from the amplifiers 38, 39 to the first deflector 6, and from the amplifiers 36, 37 to the second deflector 10. The operation of the electron beam exposure column 1 is similar to the operation of the apparatus disclosed in the aforementioned article, H. C. Pfeiffer's "Variable Spot Shaping for Electronbeam Lithography", J. Vac. Sci. Technol., 15(3), May/June, 1978, pages 887 through 890.

The basic unit pattern data memory 22 provides memory regions which correspond to the addresses $P_1$, $P_2$, $P_3$, . . . as shown in FIG. 5. That is, each memory region can store the data corresponding to one pattern, that is, the coordinate position $X_1$, $Y_1$ and the dimension $X_2$, $Y_2$ of the basic unit pattern. As the basic unit pattern data memory 22, a random access memory (RAM) system is adequate if all of the pattern data including those corresponding to unique patterns are also stored therein, though a serial memory system can be used. In the following embodiment a random access memory is used as the basic unit pattern data memory.

Referring to FIG. 5, four data $X_1$, $Y_1$, $X_2$ and $Y_2$ corresponding to each of the patterns of each basic unit pattern are stored in the memory regions $P_l$ through $P_z$ which typically consists of 64 bit memory elements. In the drawings, all data corresponding to the pattern of the mask are stored in the basic unit pattern memory. This memory is adapted to provide outputs of data $X_1$, $Y_1$, $X_2$ and $Y_2$ stored in a memory region in parallel when an address signal corresponding to the memory region is applied thereto. The data corresponding to the chip $\alpha$ are stored in the address $P_l$ through $P_m$; the data corresponding to the chip $\beta$ are stored in the address $P_{m+1}$ through $P_n$; and the data corresponding to the chip y are stored in the address $P_{n+1}$ through $P_z$. Address $P_1$ through $P_i$ store the data corresponding to the basic unit pattern data "A"; the address $P_{i+1}$ through $P_j$ store the data corresponding to the basic unit pattern data "B"; the address $P_{j+1}$ through $P_k$ store the data corresponding to the basic unit pattern data "C"; the address $P_{k+1}$ through $P_l$ store the data corresponding to the basic unit pattern data "D"; and the address $P_{l+1}$ through $P_m$ store the data corresponding to the basic unit pattern data "E". With respect to the address $P_{m+1}$ through $P_z$, since the explanation for the address $P_1$ through $P_m$ is applicable, further discussion is unnecessary. Of course, only data corresponding to a part of the patterns of the mask may be stored in the basic unit pattern data memory, and such stored data may be replaced with those corresponding to the other patterns of the mask when the exposure of the patterns designated by the stored data is completed.

In addition to the above-mentioned basic unit pattern data memory, a memory system 26 connected to the central processing unit 21 is provided in the system so as to store image data, that is, the position data $(X_3, Y_3)$, and provide them to the central processing unit 21. This additional memory system 26 may be of the type used in the conventional electron beam exposure system as a pattern data memory, though it need not have a large capacity or a high speed of operation. The main memory usually included in the central processing unit can be used as the memory system 26.

Next, an explanation will now be given with respect to the exposing process of the apparatus constructed according to the block diagram shown in FIG. 4.

At first, a mask plate is loaded onto the X-Y stage 12, next, and the column 1 is kept in a vacuum state and the well known adjustment operation of the electron beam is carried out for projecting an accurate pattern according to the deflection signal from the control system as will be described later. Next, the length of the distance to be displaced is commanded from the X-Y control 40 to the X-Y stage driving motor 41 in accordance with the position to be displaced which is specified by the central processing unit 21. As a result, the X-Y stage 12 is displaced by means of the X-Y stage driving motor 41. The position of the X-Y stage is always detected by the position detector 42; the detector position is compared with the position to be displaced as commanded by the X-Y control 40, and the length of the distance to be displaced is corrected so that the detected position coincides with the position which is commanded by the X-Y control 40. In this case, a conventional measuring apparatus using a laser is used for carrying out position control. As is well known, the minute adjustment of the position of the mask plate can be replaced with that of the electron beam which is usually performed by adjusting the coordinate of the point of origin in the central processing unit.

In the above-mentioned positioning process, a mask plate is first set in position for exposing the chip $\alpha_1$. When exposure of the chip $\alpha_1$ is completed, the X-Y stage 12 is displaced so that the chip $\alpha_2$ can be exposed. This operation is repeated until exposure of the chip $\alpha_{37}$ is completed. When exposure of the chip $\alpha_{37}$ is completed, the wafer is displaced so that chip $\gamma_1$ shown in FIG. 1 is exposed. When exposure of the chip $\gamma_1$ is completed, the wafer is displaced for exposing the chip $\alpha_{38}$. By repeating the above-mentioned exposing operation for each chip, exposure of the entire mask shown in FIG. 1 can be completed.

Next, explanation will now be given with respect to the exposure of the chip $\alpha_1$.

At first, the central processing unit 21 sets the data of an initial point (8, 8) corresponding to the data position $(X_3, Y_3)$ of the basic unit pattern $A_1$ in the first and the second registers 28, 29. The central processing unit 21 sets a head address $P_1$ in the address counter 25 and also sets a final data address $P_{1+9}$ for the basic unit pattern $A_1$ in the final address register 23. The position data $(X_3, Y_3)$ is stored in the additional memory system 26 which is connected to and controlled by the central processing unit 21. Moreover this additional memory system 26 stores basic unit pattern designating data, which may be the head address data and the final address data to be read out to the central processing unit 21. These position data and basic unit pattern designating data may be stored in a form of a pair in the memory 26. The clock circuit 27, started by a command from the central processing unit 21, actuates the basic unit pattern data memory 22 so that the data in the address designated by the address counter 25 are read out successively in accordance with the clock signal from the clock circuit 27. As a result, the exposing process is started. After starting the exposing process at first the data in the address $P_1$ is read out, and the dimension data $X_2(3)$ and $Y_2(30)$ are set in the digital-analog converters 34 and 35 which convert the dimension data to analog outputs, respectively. The data of the positions $X_1(1)$ and $Y_1(2)$ are added together with the data $X_3(8)$ and $Y_3(8)$ set in the first and the second registers 28, 29, in the adders 30 and 31, respectively, and the added values are set in the digital-analog converters 32 and 33 which convert the position data to analog outputs, respectively. The amplifiers 38, 39 receive the analog outputs of the digital-analog converters 34, 35 respectively and provide deflecting signals to the deflector 6 so as to control the dimension of the cross section of the electron beam passing through the second slit 8. The amplifiers 36, 37 receive the analog outputs of the digital-analog converters 32, 33 respectively and provide deflecting signals to the deflector 10 so as to control the projecting position of the electron beam. During the setting time of the digital-analog converter 32 through 35, the projection of the electron beam onto the mask plate is interrupted by the blanking deflector 9 controlled by the clock circuit 27 through blanking amplifier 40. When the setting time of the digital-analog converter has elapsed, the electron beam exposure column 1 is released from the blanking state, and the electron beam having a cross section the same as the pattern $a_1$ shown in FIG. 3 is projected at the position $(X_1+X_3, Y_1+Y_3)$ on the chip.

Next, the address counter 25 receives a clock signal from the clock circuit 27 and is advanced one step. Concurrently with this operation, the clock circuit 27 actuates the basic unit pattern data memory 22 with the clock signal for reading the data corresponding to the address $P_2$. The aforementioned operation is repeated until the exposure step corresponding to the content of the data of the address $P_{1+9}$ is completed.

When the content of the address counter 25 coincides with the content of the final data address register 23, a coincident signal is supplied from the coincidence circuit 24 to the central processing unit 21 to indicate that exposure of pattern $A_1$ is finished. After receiving the coincident signal, the central processing unit 21 reads out the data in the next address of the memory 26, which would indicate the next basic unit pattern $A_2$, then the next exposure operation starts.

Similarly, basic unit patterns $A_2$ through $A_8$ are exposed, and thereafter the basic unit patterns $B_1$ through $B_4$, $C_1$, $C_2$, D and E are also exposed.

When exposure of one chip is completed, the next chip is exposed.

In the above-mentioned embodiment, all basic unit pattern data corresponding to the mask or the wafer are stored in the basic unit pattern memory. However, one or several kinds of basic unit patterns for the mask or the wafer may be stored in the basic unit pattern memory, so that when exposure of a stored basic unit pattern is completed, one or several kinds of other basic unit patterns are stored, and the exposure mentioned above is repeated until the whole pattern is exposed.

The characteristic feature of the invention resides in the simple hardware which is added to the electron beam exposure apparatus. In the present invention, the same basic unit pattern is repeatedly exposed by using the simple hardware. Therefore, in the present invention, the number of pattern data which are stored in the apparatus can be greatly decreased and the amount of data to be transferred can also be greatly decreased as compared with the prior art in which every data to be used for the exposure is transferred from the electronic computer. The electronic computer including the aforementioned additional memory system is actuated in the present invention only when the address data for the basic unit patterns are transferred into the basic unit pattern data memory and when the basic unit pattern to be exposed is positioned. Therefore, according to the present invention, a high speed electron beam exposure system can be obtained without using a large capacity, high speed semiconductor memory.

In the above-mentioned description, the electron beam exposure system utilizes an electron beam having a rectangular section. However, the same effect can also be obtained when the present invention is applied to all kinds of digitally-controlled electron beam exposure apparatus including the flying spot type apparatus.

What is claimed is:

1. An electron beam exposure system for projecting an image on a material at a plurality of locations with respect to said material, said image being composed of a plurality of patterns of regions to be exposed, said patterns being arranged at predetermined locations with respect to said image and said regions being arranged at predetermined locations with respect to the corresponding pattern, at least one of said patterns appearing more than once within said image so that not all of the patterns forming said image are unique, comprising
first memory means for storing pattern data for each unique pattern in at least one image, the pattern data for each pattern corresponding to the dimensions of each region forming said pattern and to the position of each region forming said pattern with respect to said pattern;
second memory means for storing image data for said at least one image, said image data corresponding to the position with respect to said at least one image at which each unique pattern forming said at least one image appears on every occurrence thereof;
electron beam exposure column means for projecting an electron beam having a rectangular cross-section, said electron beam exposure column means including positioning means for positioning said material for exposure to said electron beam, first deflection means for controlling the dimensions of said electron beam, and second deflection means for controlling the position of said electron beam;
and control means operatively connected to said first and second memory means and to said electron beam exposure column means for projecting said at least one image, said control means comprising first means for moving said positioning means to allow material supported thereon to achieve said at least one image, second means for combining said pattern data and said image data to derive a position signal corresponding to the position of each region within said at least one image to be exposed, said position signal being communicated to said second deflection means, and third means for deriving from said pattern data a dimension signal corresponding to the rectangular dimensions of each region within said at least one image to be exposed, said dimension signal being communicated to said first deflection means.

2. The electron beam exposure system of claim 1, wherein said second means comprises first and second register means operatively connected to said second memory means for receiving said image data, first and second adder means operationally connected to said first memory means and to said first and second register means, respectively, for adding said image data to that portion of said pattern data corresponding to region position, and first and second digital-analog converter means operationally connected to said electron beam exposure column means and to said first and second adder means, respectively, for supplying an analog signal delivered to said second deflection means.

3. The electron beam exposure system of claim 2, wherein said third means comprises third and fourth digital-analog converter means operationally connected to said first memory means and to said electron beam exposure column means for receiving that portion of said pattern data corresponding to region dimension and supplying an analog signal delivered to said first deflection means.

4. The electron beam exposure system of claim 3, wherein said positioning means comprises an X-Y stage mounted within said electron beam exposure column means and wherein said first means comprises a motor operationally connected to said X-Y stage, a position detector operationally connected to said X-Y stage, and X-Y stage control means operationally connected to said motor and said position detector for moving said X-Y stage after said at least one image is complete.

5. The electron beam exposure system of claim 4, wherein both said first and second memory means comprise random access memories.

6. The electron beam exposure system of claim 5, further comprising third memory means for storing head address and final address data corresponding to the pattern data for each pattern stored in said first memory means, and wherein said second means further comprises means for successively addressing said first memory means to obtain all the pattern data identified by said head and final address data before changing the image stored in said first and second register means.

7. The electron beam exposure system of claim 6, wherein said means for successively addressing said first memory means comprises a final address register, address counter means for storing said head address, clock circuit means for incrementing said address counter means, and coincidence circuit means for comparing the contents of said final address register and said address counter means.

8. The electron beam exposure system of claim 6, wherein said electron beam exposure column means further comprises third deflector means operationally connected to said clock circuit means for interrupting said electron beam during the setting time of the digital-analog converter means.

* * * * *

UNITED STATES PATENT AND TRADEMARK OFFICE
CERTIFICATE OF CORRECTION

PATENT NO. : 4,291,231
DATED : Sept. 22, 1981
INVENTOR(S) : Kenichi Kawashima et al.

It is certified that error appears in the above-identified patent and that said Letters Patent are hereby corrected as shown below:

Front page, [73] Assignee, after "Fujitsu Limited" insert the city --Kawasaki,--.

Col. 1, line 51, after "bits" "," should be --;--;
line 57, after "second" "," should be --;--.

Col. 2, line 15, "region" should be --regions--;
line 46, "controlling" should be --controlled--.

Col. 3, line 3, after "coincide" insert --;--.

Col. 4, line 46, after "D", insert --and--.

Col. 5, line 41, "pressing" should be --processing--.
Col. 7, line 20, "$P_1$" should be --$P\ell$ --;
line 47, "next, and" should be --and next,--;
line 58, "detector" should be --detected--.

Col. 8, line 38, after "process" insert --,--.

Col. 11, line 7, after "image" insert --data--.

Signed and Sealed this

Nineteenth Day of January 1982

[SEAL]

Attest:

Attesting Officer

GERALD J. MOSSINGHOFF

Commissioner of Patents and Trademarks